Figure 1:
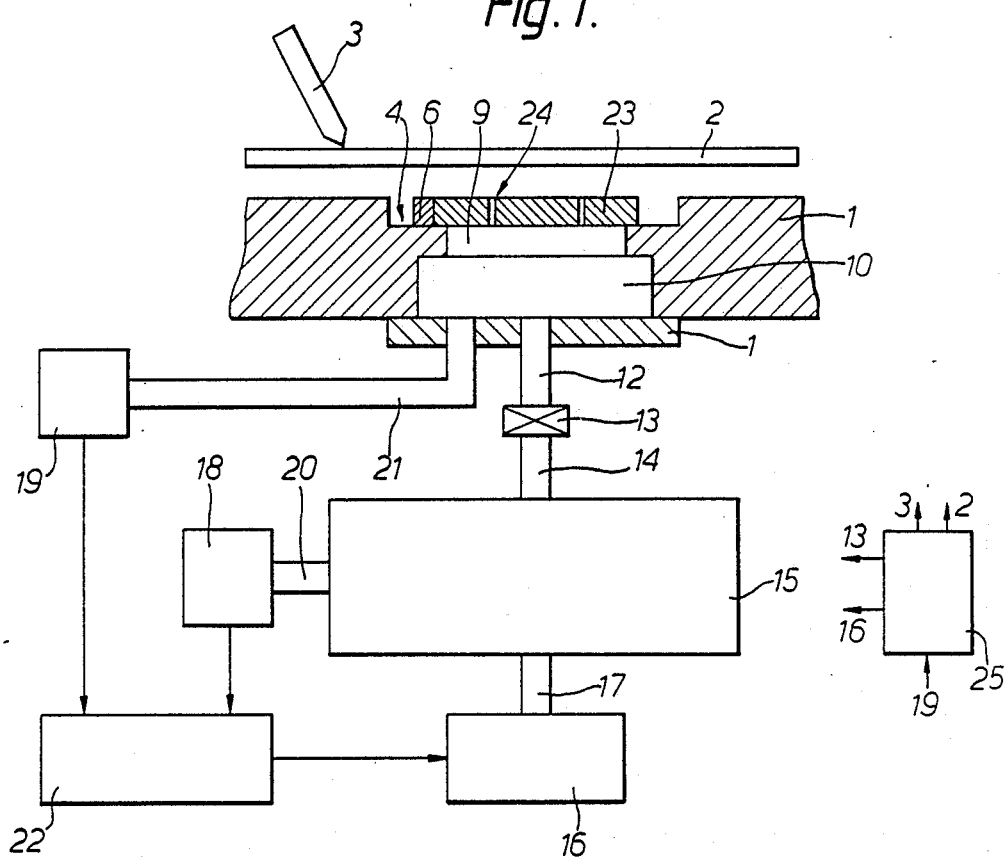

United States Patent [19]

Cleemput

[11] Patent Number: 4,959,246
[45] Date of Patent: Sep. 25, 1990

[54] SCREEN PRINTING PROCESS AND APPARATUS AND ELECTRICAL PRINTED CIRCUITS OBTAINED THEREWITH

[75] Inventor: Camiel D. Cleemput, Wondelgem - Gent, Belgium

[73] Assignee: International Standard Electric Corporation, New York, N.Y.

[21] Appl. No.: 617,853

[22] Filed: Jun. 6, 1984

[30] Foreign Application Priority Data

Jun. 6, 1983 [BE] Belgium .............................. 2/60122

[51] Int. Cl.⁵ .............................................. C23C 26/00
[52] U.S. Cl. ...................................... 427/97; 427/294
[58] Field of Search ................................. 427/97, 294

[56] References Cited

U.S. PATENT DOCUMENTS

| | | | |
|---|---|---|---|
| 3,357,856 | 12/1967 | Ragan | 427/97 |
| 4,278,706 | 7/1981 | Barry | 427/96 |
| 4,301,192 | 11/1981 | Plichta | 427/97 |
| 4,323,593 | 4/1982 | Tsunashima | 427/97 |
| 4,486,738 | 12/1984 | Sadlo | 427/96 |

FOREIGN PATENT DOCUMENTS 2030007 3/1980 United Kingdom .

OTHER PUBLICATIONS

Lau et al, "Vibrational Introduction of Fine Metallic Powder into Small Holes", IBM TDB, vol. 14, No. 9, Feb. 1972.

Primary Examiner—Shrive Beck
Assistant Examiner—V. Duong Dang
Attorney, Agent, or Firm—Spencer & Frank

[57] ABSTRACT

A process for providing through plated holes in a substrate by screen printing provides uniformly thick plating of the holes. One side of the substrate is screen plated while being subjected to an underpressure between 10 and 200 gr/cm² from a chamber fed by a large volume vacuum vat. When treating the other side of the substrate, vacuum may be increased up to 2.5 times the first underpressure.

3 Claims, 2 Drawing Sheets

SCREEN PRINTING PROCESS AND APPARATUS AND ELECTRICAL PRINTED CIRCUITS OBTAINED THEREWITH

The present invention relates to a screen printing process which comprises the steps of applying an electrically conductive paste through a screen and by means of a movable squeegee to a surface of a substrate provided with at least one hole extending between said surface and another surface of the substrate and in meanwhile exerting an underpressure on said other surface so as to coat at least part of the inner wall of said hole with said paste.

Such a process is known from the article "Thickfilm or : using metallized thru holes, multilayer structure, and surface mounting components for highest packing density. A study" by M. Bergmann, published in the Proceedings of the 4th European Hybrid Microelectronics Conference, Copenhagen, May 17–20, 1983.

An object of the present invention is to provide a process of the above type which operates satisfactorily for various numbers of holes in the substrate and for various dimensions of these holes.

According to the invention this object is achieved due to the fact that said underpressure is substantially constant and equal to a value comprised between 10 $gr/cm^2$ and 200 $gr/cm^2$.

Another characteristic feature of the present process is that said underpressure is obtained from a vacuum vat.

Still another characteristic feature of the present process is that said underpressure is realized in a vacuum chamber located next to said substrate and communicating with said vacuum vat having a volume which is relatively large with respect to that of said vacuum chamber.

By the use of a vacuum vat of relatively large volume the underpressure realized below the substrate remains substantially constant during a printing process although during such a process the number of coated holes increases as the squeegee is moved over the substrate, such coated holes having smaller dimensions than uncoated holes.

The present invention also relates to a screen printing apparatus for applying the above described process. This apparatus is characterized in that it includes a work table, a screen and a movable squeegee, said work table having a cavity which communicates with a vacuum chamber coupled via a first conduct, a valve and a second conduct in series with a vacuum vat itself coupled with a vacuum generator.

Finally, the present invention also relates to printed electrical circuits realized by means of the above described process and also to such circuits made with the above described apparatus.

Figure 2:
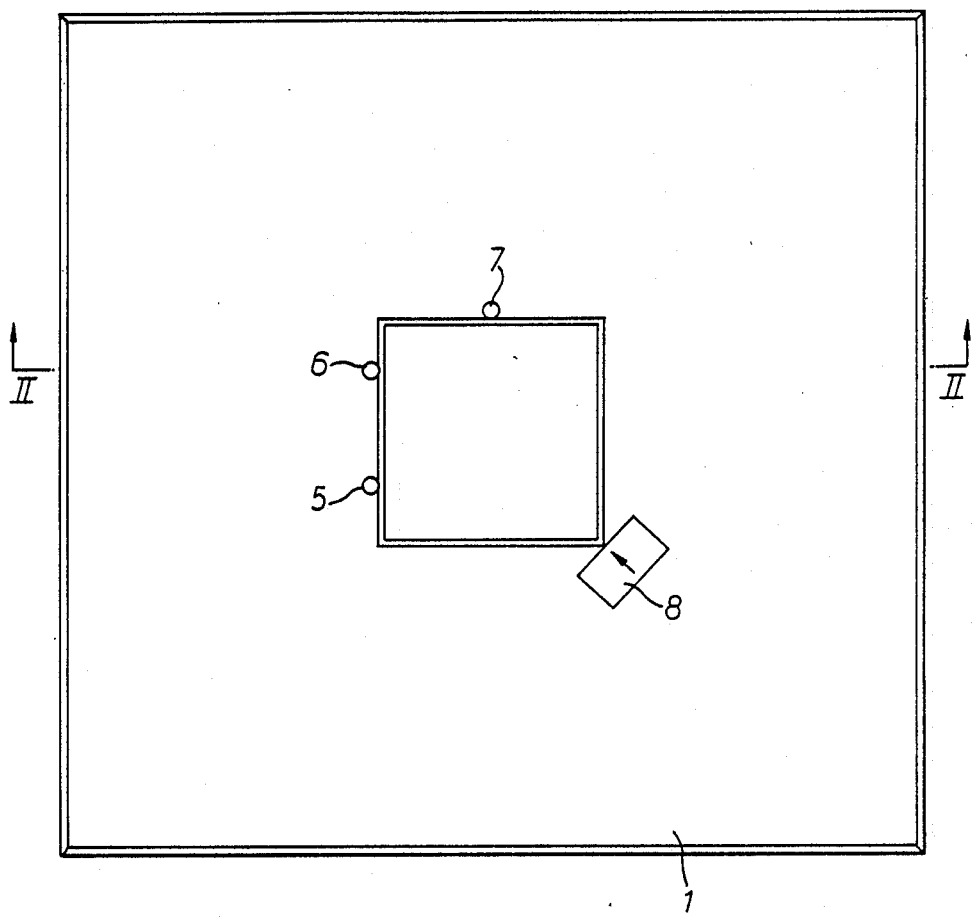

The above mentioned and other objects and features of the invention will become more apparent and the invention itself will be best understood by referring to the following description of an embodiment taken in conjunction with the accompanying drawings wherein:

FIG. 1 is a schematic view of screen printing apparatus according to the invention with a work table 1 thereof represented in cross-section along line II—II in FIG. 2, the various parts being drawn on different scales, while FIG. 2 is a schematic top plan view of this work table.

The screen printing apparatus shown includes a work table 1, a screen 2 and a movable squeegee 3, the screen 2 and the squeegee 3 being both mounted above the work table 1. The latter has a cavity 4 wherein three stationary abutments 5, 6, 7 and a schematically represented movable abutment 8 are mounted. The bottom of the cavity 4 is provided with a large suction hole 9. This hole 9 establishes a communication between the cavity 4 and a vacuum chamber 10 which is closed by a cover 11 and is coupled via a conduct 12, a valve 13 and a conduct 14 with a vacuum vat 15. The ratio of the sum of the volumes of vat 15 and conduct 14 and the sum of the volumes of chamber 10 and conduct 12 is substantially equal to 500, both the conducts 12 and 14 having a diameter of 5 cm. The latter sum volume is equal to about 150 $cm^3$. The vacuum vat 15 is coupled with a vacuum generator 16 via a conduct 17 and this vat 15 and the chamber 10 are coupled to corresponding underpressure control devices 18 and 19 via conducts 20 and 21 respectively. These devices have electric outputs which are coupled to inputs of an electric control circuit 22 whose output is connected to a control input of the vacuum generator 16. Thus a servo loop is formed which includes the elements 16, 14, 10, 18, 19 and 22. This servo loop ensures that the underpressure measured in the devices 18 and 19 remains within 10% of a set value and differs from this value by at most 3 $gr/cm^2$.

A square ceramic substrate 23 is located in the cavity 4 and is pushed into contact with the abutments 5, 6 and 7 by the movable abutment 8. This substrate 23 has a length equal to about 5 cm and a thickness of 0.076 cm and is provided with holes, such as 24, extending between both surfaces thereof. The diameter of these holes is equal to 0.035 cm.

Finally, there is provided a general control device 25 which controls the screen 2, the squeegee 3, the valve 13 and the vacuum generator 16 and which is controlled by the underpressure control device 19.

The above described screen printing apparatus operates as follows under the control of the device 25.

At the start of a printing operation the underpressure control devices 19 and 18 are set to predetermined underpressure values equal to e.g. 44 $gr/cm^2$ and 47 $gr/cm^2$ respectively, the pressure loss between chamber 10 and vat 15 being assumed equal to 3 $gr/cm^2$. The generator 16 is then operated and as a consequence the wanted underpressure of 47 $gr/cm^2$ is realized in the vat 15. No underpressure is realized in vacuum chamber 10 because valve 13 is closed. A certain amount of electrically conductive paste, e.g. DP 9061 or DP 6120 of Dupont de Nemours, is then brought in front of the squeegee 3, after which the latter is displaced over the screen 2. In this way a layer of uniform thickness is formed on this screen 2 which is supposed to be provided with a first mask (not shown).

When this operation is finished and the squeegee 3 has returned to its initial position, the valve 13 is opened. Because of the above mentioned relative large ratio of the value of the volumes of the elements 14, 15 and 10, 12 the wanted underpressure of 44 $gr/cm^2$ is very rapidly realized in the vacuum chamber 10. The squeegee 3 is then lowered and displaced over the substrate 23 with a speed equal to 7 cm/sec to push the paste layer on the screen 2 through this screen 2 on the upper surface of the substrate 23. Due to the presence of the first mask on this screen 2 a first electric circuit is formed on this upper surface. Because of the underpressure in the vacuum chamber 10 the substrate 23 is firmly applied against the bottom of the cavity 4 and the inner walls of the holes, such as 24, in this substrate 23 are coated with a layer of paste which extends over about 50% to 90% of the thickness of the substrate 23.

To be noted that because of the relatively large volume of the vat 15 the underpressure in the vacuum chamber 10 remains substantially constant although due to the moving squeegee 3 the holes 24 in the substrate 23 are gradually coated with paste and thus become smaller.

The printed substrate thus obtained is then dried and possibly baked, after which it is reversed and submitted to a new printing operation. However, for this operation the screen 2 carries a second mask (not shown) and the underpressure in the vacuum chamber is now set at a value equal to e.g. 96 gr/cm$^2$. Such a higher underpressure can be required because of the reduced dimension of the holes 24 in the substrate 23. Thus a second electric circuit is printed on the substrate 23 and the coating of the inner walls of these holes 24 is completed. As a consequence electric interconnections are realized between the electric circuits on both the surfaces of the substrate 23.

When the underpressure in the vacuum chamber 10 does not reach the wanted value, e.g. due to the substrate 23 being curved, the underpressure control device 19 sends a signal to the general control device 25 which inhibits a printing operation. In this connection it should be noted that for a large substrate the flexing thereof can be prevented by supporting it by one or more pieces disposed in the cavity 4 at locations where the substrate has no holes 24. These supporting pieces may for instance be magnetic when the bottom of the cavity 4 is made of metal.

The above described screen printing apparatus has provided best results for the characteristics given above. Similar results are obtained if the following requirements are fulfilled :

the above mentioned ratio of volumes is at least equal to 100;

the ratio of the thickness of the substrate 23 and the diameter of the holes 24 is comprised between 1.5 and 5;

the speed of displacement of the squeegee 3 is comprised between 2.5 cm/sec and 20 cm/sec;

the ratio of the underpressures in the vacuum chamber 10 during the printing of the second and first surfaces of the substrate 23 is comprised between 1 and 2.5;

the underpressure in the vacuum chamber 10 is maintained within ±10% of its set value with a maximum deviation of 3 gr/cm$^2$;

during the printing operation the viscosity of the paste should not increase by more than 30% above the initial value.

To be noted that the present screen printing apparatus operates satisfactorily even with holes 24 located at 0.08 cm from the edge of the substrate 23 so that the designer of the electric circuits has a high degree of freedom in positioning these holes on the substrate.

While the principles of the invention have been described above in connection with specific apparatus, it is to be clearly understood that this description is made only by way of example and not as a limitation on the scope of the invention.

I claim:

1. Screen printing process which comprises the steps of: applying an electrically conductive paste through a screen and by means of a movable squeege to a surface of a substrate provided with at least one hole extending between said surface and another surface of said substrate; and exerting an underpressure on said another surface so as to coat at least part of the inner wall of said hole with said paste; characterized in that said underpressure is substantially constant and equal to a first value between limits of 10 gr/cm$^2$ and 200 gr/cm$^2$, in that said underpressure is obtained from a vacuum vat, and in that said underpressure is realized in a vacuum chamber located next to said substrate and communicating with said vacuum vat, said vacuum vat having a volume which is relatively large with respect to that of said vacuum chamber.

2. A screen printing process in accordance with claim 1, characterized in that:

said vacuum chamber and vacuum vat are intercoupled via first and second conducts connected through a valve, the ratio of the sum of the volumes of said vacuum vat and said second conduct and the sum of the volumes of said vacuum chamber and said first conduct being at least equal to 100.

3. A screen printing process in accordance with claim 2 characterized in that:

said first and second conducts have a diameter at least equal to 5 cm.

* * * * *